(12) United States Patent
Tanis

(10) Patent No.: US 7,411,463 B2
(45) Date of Patent: Aug. 12, 2008

(54) METHOD, SYSTEM, APPARATUS, AND PROGRAM FOR MEASURING THE DAMPING FACTOR OF AN NTH ORDER PHASE LOCKED LOOP (PLL)

(75) Inventor: Terrence J. Tanis, Chicago, IL (US)

(73) Assignee: Tellabs Operations, Inc., Naperville, IL (US)

( * ) Notice: Subject to any disclaimer, the term of this patent is extended or adjusted under 35 U.S.C. 154(b) by 40 days.

(21) Appl. No.: 11/591,139

(22) Filed: Oct. 31, 2006

(65) Prior Publication Data

US 2008/0111636 A1 May 15, 2008

(51) Int. Cl.
*G01R 23/00* (2006.01)
*H03L 7/085* (2006.01)

(52) U.S. Cl. .................. 331/44; 331/17; 324/76.53; 324/76.68

(58) Field of Classification Search .............. 331/44, 331/17; 324/76.53, 76.68
See application file for complete search history.

(56) References Cited

U.S. PATENT DOCUMENTS 5,787,134 A * 7/1998 Kovacs .................. 375/376
6,842,056 B1 * 1/2005 Wong et al. ............... 327/147
6,873,214 B2 * 3/2005 Harwood .................. 331/17

OTHER PUBLICATIONS

Roland E. Best, *Phase-Locked Loops: Design, Simulation, and Applications*, Fifth Edition, Chapter 11, McGraw-Hill, pp. 327-340, 2003.

* cited by examiner

*Primary Examiner*—Joseph Chang
(74) *Attorney, Agent, or Firm*—Fitzpatrick, Cella, Harper & Scinto

(57) ABSTRACT

A method for measuring the damping factor of an $N^{th}$-order phase-locked loop, wherein N>1, and a system, apparatus, and program that operate in accordance with the method. The method includes applying a modulation source at an input to the phase-locked loop. The method also includes measuring the output response to various levels of frequency modulation, measuring the −3 dB cutoff frequency of the phase-locked loop, and measuring the peak frequency of the phase-locked loop. The method further includes calculating the damping factor of the phase-locked loop as a function of the −3 dB cutoff frequency and the peak frequency.

18 Claims, 6 Drawing Sheets

Frequency (Hz)

METHOD, SYSTEM, APPARATUS, AND PROGRAM FOR MEASURING THE DAMPING FACTOR OF AN NTH ORDER PHASE LOCKED LOOP (PLL)

BACKGROUND OF THE INVENTION

1. Field of the Invention

This invention relates to a method, system, apparatus, and program for characterizing phase-locked loop (PLL) behavior, and more particularly to an improved method, system, apparatus, and program for measuring the damping factor of $N^{th}$-order PLLs.

2. Related Art

A phase-locked loop (PLL) is an electrical circuit which can find use in a number of different fields. For example, PLLs are used in radio, telecommunications, space communications, computers, and other electronic applications in which it is desired to stabilize a generated signal or to detect signals in the presence of noise. As a particular example, PLLs are often employed in frequency-synthesized radio transmitters and receivers. A PLL can also act as a detector in a frequency-modulation (FM) or phase-modulation (PM) receiver. Thus, a PLL can be understood to be a closed-loop feedback control system that maintains a generated signal in a fixed phase relationship relative to a reference signal.

Typically, a PLL is designed using circuit modeling techniques that assume ideal component performance. Like all hardware design, the circuits are then validated in the lab on prototype modules for conformance to expected behavior. The damping factor ($\zeta$) of a PLL can be an important characteristic in defining the dynamic performance of the PLL. As such it is necessary to measure the damping factor $\zeta$ of a PLL.

An example of a fairly well known approach to measuring the damping factor $\zeta$ of a PLL is provided in the publication entitled *Phase-Locked Loops: Design, Simulation, and Applications, Fifth Edition*, by Roland E. Best. Section 11.5 of this text describes an example of how to make the damping factor measurement using commonly available test equipment.

However, one drawback to this method, as stated in the publication, is that it is only suitable for measuring PLLs in which the damping factor $\zeta$ is expected to be less than 1.0. The reason for this is that this approach relies on being able to measure the output's time-domain response to a phase-step transient injected at the PLL's input. Specifically, this requires being able to measure the amplitude of successive peak overshoot and undershoot portions of the signal wave, and then, in turn, using a mathematical relationship of the ratio of these measurements to calculate the damping factor. In the case of PLLs with a damping factor $\zeta$ equal to or greater than 1.0, it is not possible to use this method because there is no undershoot portion of the signal wave. Since many of the PLLs used in telecommunications products have a damping factor $\zeta$ higher than 1.0, this approach is unsuitable for taking this measurement. An improved approach is therefore needed.

A second drawback to the approach described above is that it requires a different test setup than that used to determine the −3 dB cutoff frequency of the PLL. Generally, when characterizing a PLL in the lab, a user will want to measure, at a minimum, both the −3 dB cutoff frequency and the damping factor $\zeta$ of the loop, as these are two of the most important characteristics that specify a PLL's dynamic behavior. All other PLL parameters can be derived from them. Using two different test setups to attain these measurements can add time and complexity to the procedure. A unified test configuration would be preferred.

There exists, therefore, a need to provide a novel method for measuring the damping factor $\zeta$ of a $2^{nd}$-order PLL that overcomes the above-noted and other drawbacks of the existing methods.

SUMMARY OF THE INVENTION

The foregoing and other problems are overcome by an improved method for measuring the damping factor $\zeta$ of a $2^{nd}$-order PLL, and also by a system, apparatus, and program that operate in accordance with the method.

According to an aspect of the invention, a method for measuring the damping factor of an $N^{th}$-order phase-locked loop, wherein N>1, includes the steps of applying a modulation source at an input to the phase-locked loop and measuring an output response to various levels of frequency modulation. The method also includes the steps of measuring a −3 dB cutoff frequency of the phase-locked loop, measuring a peak frequency of the phase-locked loop, and calculating the damping factor of the phase-locked loop as a function of the −3 dB cutoff frequency and the peak frequency.

According to another aspect of the invention, a system for measuring the damping factor of an $N^{th}$-order phase-locked loop, wherein N>1, includes a modulation source adapted to apply an input to the phase-locked loop. The system also includes at least one unit adapted to generate an output response to various levels of frequency modulation and calculate the damping factor of the phase-locked loop as a function of a −3 dB cutoff frequency and a peak frequency of the generated output response.

According to another aspect of the invention, a system for measuring the damping factor of an $N^{th}$-order phase-locked loop, wherein N>1, includes a modulation unit adapted to apply an input to the phase-locked loop. The system also includes a first measuring unit adapted to measure an output response to various levels of frequency modulation, a second measuring unit adapted to measure a −3 dB cutoff frequency of the phase-locked loop, and a third measuring unit adapted to measure a peak frequency of the phase-locked loop. The system further includes a calculating unit adapted to calculate the damping factor of the phase-locked loop as a function of the −3 dB cutoff frequency and the peak frequency.

BRIEF DESCRIPTION OF THE DRAWINGS

The present invention will be more readily understood from a detailed description of the exemplary embodiments taken in conjunction with the following figures.

The invention will next be described in connection with certain exemplary embodiments; however, it should be clear to those skilled in the art that various modifications, additions, and subtractions can be made without departing from the spirit or scope of the claims.

DETAILED DESCRIPTION OF THE PREFERRED EMBODIMENTS

An example embodiment of the invention provides an improved method for measuring the damping factor $\zeta$ of an $N^{th}$-order PLL, and also a system, apparatus, and program that operate in accordance with the method. One common application of a PLL is to synchronize a variable local oscillator with the phase of a transmitted signal. In such an application, the PLL controls the oscillator so as to operate at a constant phase angle relative to a reference signal source.

A more specific example is found in the field of signal transmission, in which a transmitter generates an RF carrier signal, amplifies the signal, and modulates it with a program signal. The RF carrier signal is a sine wave generated by an oscillator (e.g. a voltage-controlled oscillator or VCO). The frequency of the oscillator needs to be tightly controlled, since if the carrier signal drifts even slightly off value, reception can be difficult or impossible, and interference with other signals on nearby frequencies can also occur. Accordingly, a PLL is often employed to continuously test the output of a VCO, such that if the frequency has drifted (either increased or decreased), the PLL generates an error voltage that pulls the VCO back on frequency.

Figure 1:
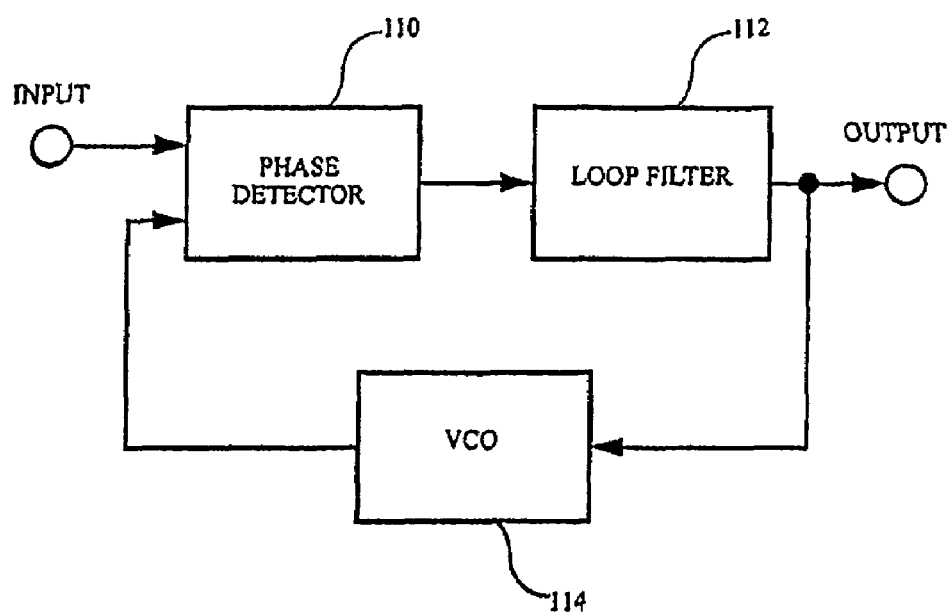
FIG. 1 is a block diagram of a basic PLL, including a phase detector 110, a loop filter 112, and a voltage-controlled oscillator (VCO) 114.

A notable consideration in transmitter circuits is to avoid harmonics and stray oscillations at undesired frequencies. In this regard, lowpass and bandpass filters are often employed to block out such undesired frequencies from the final output signal. FIG. 1 is a block diagram of a basic PLL, including a phase detector 110, a loop filter 112, and a VCO 114.

The phase detector 110 compares the phase of the output signal of the VCO 114 with the phase of the reference signal, i.e. the input signal to the phase detector 110. The phase detector 110 develops an output signal that is approximately proportional to the phase error (the phase error being the phase difference between the reference signal and the output signal of the VCO 114). The output signal of the phase detector 110 is made up of a dc component and a superimposed ac component; because the ac component is undesired, it is attenuated by the loop filter 112. The loop filter 112 responds to phase error indications from the phase detector 110 by "steering" the VCO 114 frequency higher or lower, thereby keeping the output of the VCO 114 locked in frequency and phase with respect to the reference signal. The VCO 114 is a voltage-controlled oscillator that has a voltage input and a frequency output. The frequency at the output of the VCO 114 is proportional to the voltage provided at the input within some specified frequency range. Of course, PLLs are not limited to this construction, and variations, modifications, and additions are often implemented by persons having ordinary skill in the art.

PLLs are commonly classified by their "order." The order (the number of poles of the transfer function) of a PLL is equal to the order of the loop filter+1. Accordingly, a PLL having no filter is a first-order loop, and a PLL employing a first-order loop filter, which is typical, is a second-order system. Higher-order loops (e.g., loop filters of 2, 3, or 4) exist, but can be prone to being unstable, since increasing the order also increases the phase shift of the filters. In many PLL designs, a first-order low-pass filter is used such that lower frequencies are passed and frequencies higher than the cutoff frequency are attenuated or reduced. An ideal low-pass filter would completely eliminate all frequencies above the cutoff frequency while passing those below unchanged.

Dynamic analysis of a control system is usually performed using the transfer function, which is a mathematical representation of the relationship between the input signal and output signal of the system. Two notable characteristics specifying a PLL's dynamic behavior, as mentioned, are the −3 dB cutoff frequency and the damping factor of the loop.

In general terms, the cutoff frequency of a circuit (for example a filter) is the frequency either above which or below which the power output of the filter is reduced to half of the passband power, that is, the half-power point. This is equivalent to an amplitude reduction to 70.7% of the passband, and happens to be close to −3 decibels. Thus, the cutoff frequency is frequently referred to as the −3 dB point. In essence, the −3 dB point represents the breakpoint of a filter, that is, when the filter begins filtering.

Figure 2:
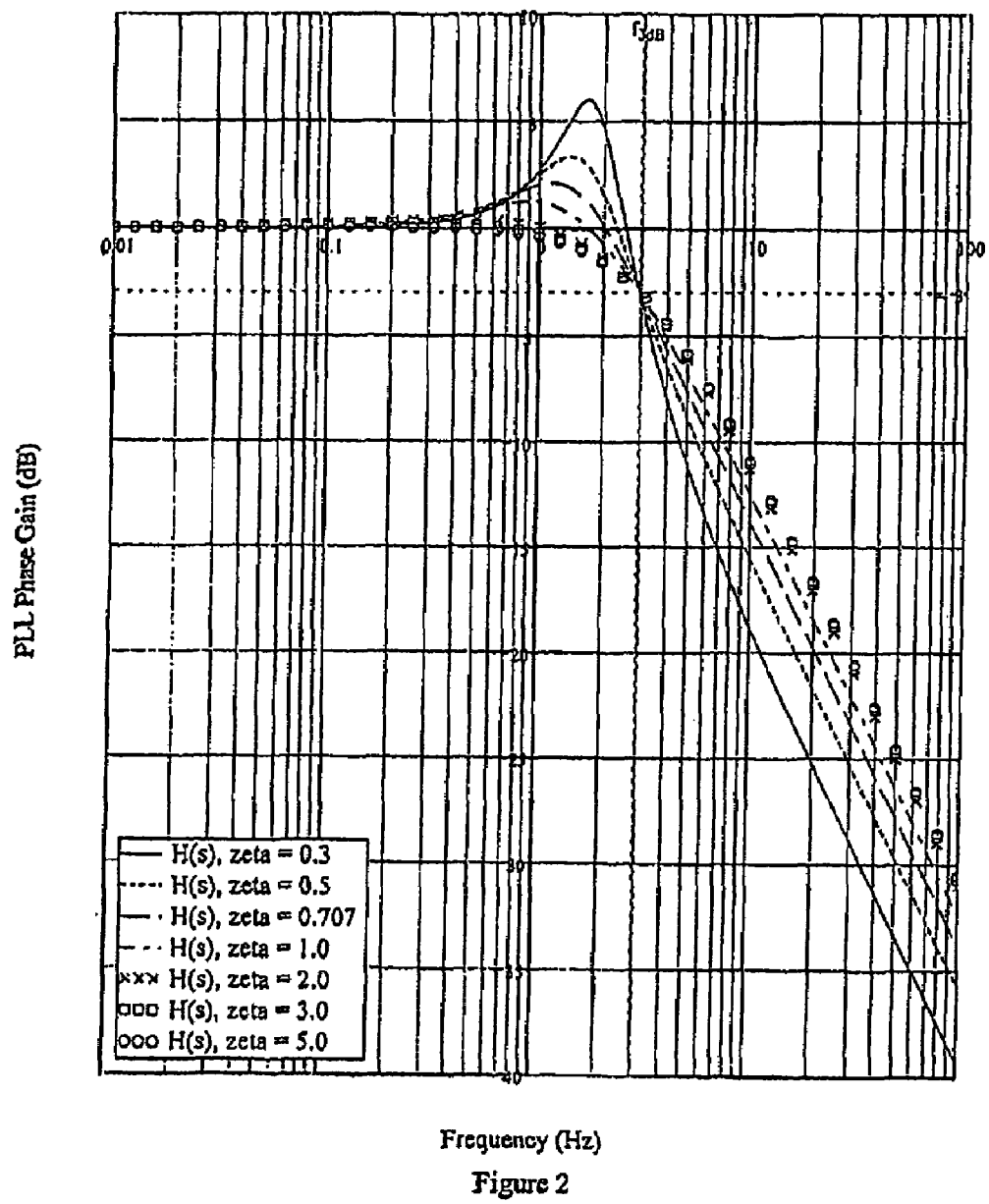
FIG. 2 shows a magnitude Bode plot representing the frequency response for a typical second-order PLL (with a first-order low-pass filter) for an exemplary −3 dB cutoff frequency of 3 Hz, corresponding to various damping factors.

The frequency response of a filter is generally represented using what is known as a Bode plot. A first-order filter, for example, reduces the signal strength by about half (approximately −6 dB) every time the frequency doubles or increases one octave. FIG. 2 shows a magnitude Bode plot representing the frequency response for a typical second-order PLL (with a first-order low-pass filter) for an exemplary −3 dB cutoff frequency of 3 Hz, corresponding to various damping factors. It is to be understood that the 3 Hz −3 dB cutoff frequency was an arbitrary selection. The plot is scaled to clearly illustrate the −20 db/decade roll-off of the low-pass filter at frequencies greater than the −3 dB cutoff frequency.

Control systems exhibit damping, which is the temporal decay of the amplitude of a free oscillation of the system, associated with energy loss from the system. A system is said to be (1) "critically damped" when the time response to an abrupt stimulus is as fast as possible with at most one overshoot of the final resting position, (2) "underdamped" (oscillatory) when overshoot occurs, and (3) "overdamped" (aperiodic) when response is slower than critical. The damping of many physical systems is typically approximated by a viscous damping coefficient in a second-order linear differential equation, or a quadratic factor in a transfer function.

In the display of a step function, overshoot is a portion of the waveform which, immediately following the step, exceeds its nominal or final amplitude. Undershoot is the portion of the waveform that, following any overshoot or rounding that may be present, falls below its nominal or final value. A filter with zero damping will vibrate or "ring" with a harmonic motion indefinitely; the lower the damping factor, the higher the ringing. Generally, a closed-loop system which exhibits high ringing may not be ideal, however, lowering the ringing can lead to losses.

An example embodiment of the invention provides a simple and efficient method of measuring the damping factor $\zeta$ of a $2^{nd}$-order PLL, and also provides a system, apparatus, and program that operate in accordance with the method. By virtue thereof, $2^{nd}$-order PLLs in which the damping factor $\zeta$ is equal to or greater than 1.0 can be measured, in addition to PLLs in which the damping factor $\zeta$ is less than 1.0. Further, measurements can be made of the damping factor $\zeta$ of a $2^{nd}$-order PLL using a minimal amount of test equipment that is commonly available in most electrical labs and using a unified test configuration.

Accordingly, the invention can be used to characterize the behavior of any $2^{nd}$-order PLL. Since this type of PLL is used extensively in many telecommunications products, it has many possible applications. Additionally, this invention can be used to design, test, or characterize $2^{nd}$-order PLLs.

In at least one example embodiment, the invention can measure a PLL's damping factor $\zeta$ when the damping factor $\zeta$ is up to 2.0 or even more: in practice, common test equipment can use the method of the invention to measure a damping factor $\zeta$ of up to 2.0, and more accurate test equipment can be employed to extend this to beyond 3.0. This can be beneficial when the invention is used in the telecommunications industry because many of the $2^{nd}$-order PLLs used in telecommunications products have a relatively high damping factor $\zeta$ (i.e., greater than 1.0) to reduce the overshoot amplitude of the loop, at the expense of longer settling times.

In accordance with an aspect of the invention, the damping factor $\zeta$ can be identified by taking measurements that were previously used only to characterize the −3 dB cutoff frequency of the loop. In other words, in previous techniques, for example in the technique discussed in the aforementioned text entitled *Phase-Locked Loops Design, Simulation, and Applications, Fifth Edition*, one test circuit was needed to measure the damping factor $\zeta$, and another test circuit was needed to measure the −3 dB cutoff frequency. An example embodiment of the invention can measure the damping factor $\zeta$ using the same test setup and measurements that were used only to measure the −3 dB cutoff frequency of the PLL in section 11.6 of *Phase-Locked Loops: Design, Simulation, and Applications, Fifth Edition*. Because of this, if reasonably accurate measurements have been made using the test procedures given in section 11.6 of that publication, then the damping factor $\zeta$ can be extrapolated using mathematical techniques.

Furthermore, an example embodiment of the invention can use a frequency-domain method for measuring the damping factor $\zeta$ of a $2^{nd}$-order PLL. In particular a $2^{nd}$-order PLL has a well-known transfer function that describes the frequency-domain behavior of the filter. Being a low-pass filter with unity gain, the PLL passes low frequencies through with theoretically no attenuation, whereas higher frequencies, i.e. those past the −3 dB cutoff frequency of the loop, are attenuated at −20 dB/decade. A plot of the transfer function would illustrate this behavior, where at the −3 dB cutoff frequency of the loop, approximately 70.7% of the input signal amplitude is transferred through to the output. As noted the −3 dB cutoff frequency is understood to be one of the main criteria needed to specify a PLL's dynamic behavior.

Also as noted, in addition to the −3 dB cutoff frequency of a PLL, the other notable defining parameter of the transfer function is the damping factor $\zeta$. The effect of damping factor $\zeta$ is well understood from a time-domain perspective: the higher the damping factor $\zeta$, the less overshoot or ring the loop will have at its output, at the expense of relatively sluggish response to input transients; the lower the damping factor $\zeta$, the more overshoot the loop will exhibit at its output, in exchange for more rapid response to input transients.

Figure 3:
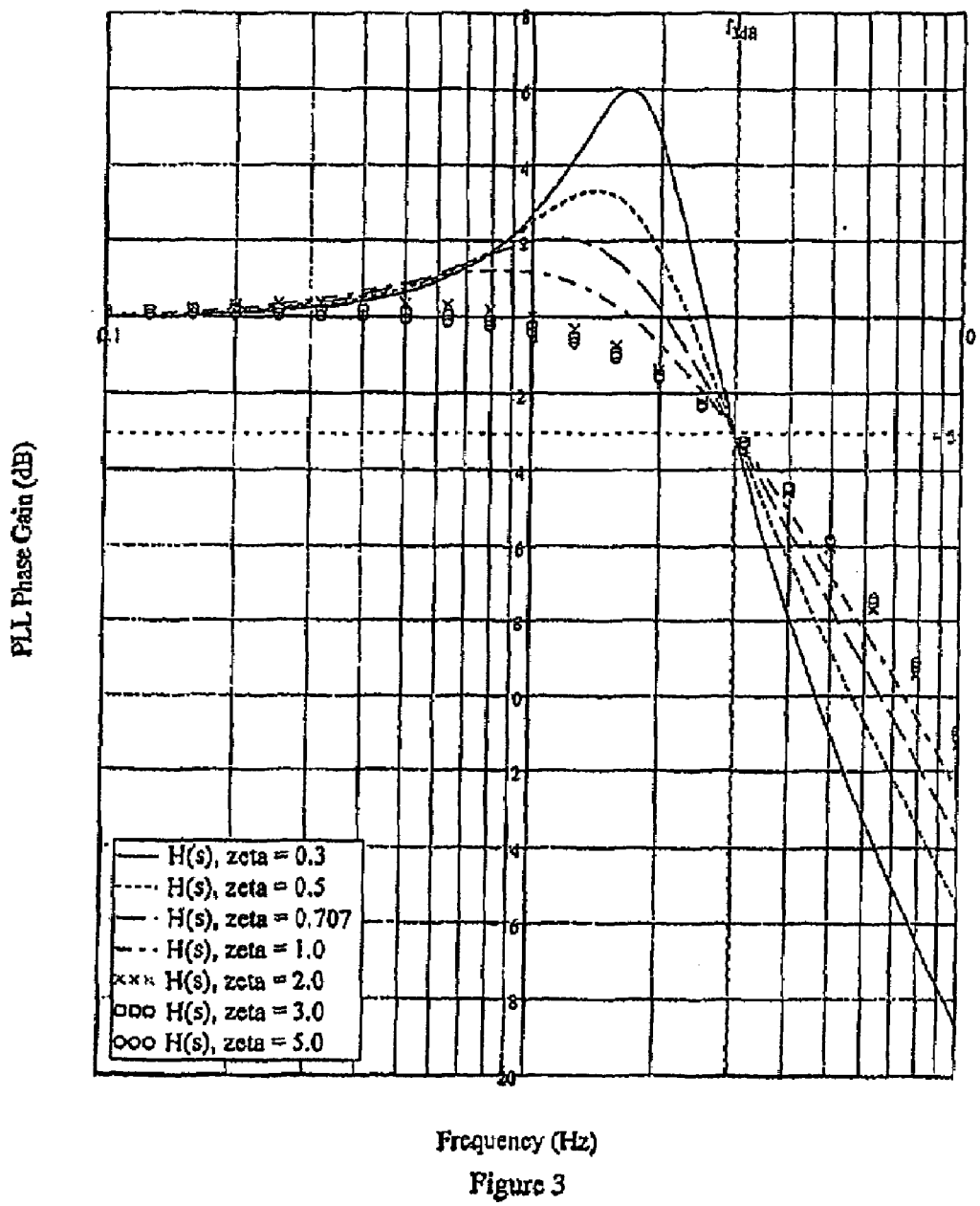
FIG. 3 shows a magnitude Bode plot representing the frequency response for a typical second-order PLL (with a first-order low-pass filter) for an exemplary −3 dB cutoff frequency of 3 Hz, corresponding to various damping factors.

The effect of the damping factor $\zeta$ is not as commonly understood in the frequency-domain, but in essence a low damping factor $\zeta$ causes the frequency-domain response of the PLL to exhibit higher peaking in the transfer function before the −3 dB cutoff frequency; this is shown in the plot of FIG. 3, in which the various levels of peaking would correspond to various damping factors. Conversely, a high damping factor $\zeta$ exhibits relatively little peaking in the transfer function. What this means from a filter or frequency transfer standpoint is that PLLs with a high damping factor $\zeta$ have nearly unity gain from 0 Hz up to almost the −3 dB cutoff frequency of the loop, known as the passband region, whereas PLLs with a low damping factor $\zeta$ amplify some frequencies (i.e. provide gain greater than 1) in the passband. In particular, FIG. 3 shows a magnitude Bode plot representing the frequency response for a typical second-order PLL (with a first-order low-pass filter) for an exemplary −3 dB cutoff frequency of 3 Hz, corresponding to various damping factors. It is to be understood that the 3 Hz −3 dB cutoff frequency was an arbitrary selection. The plot is scaled to clearly illustrate the frequency range of interest, i.e. from DC up to the −3 dB cutoff frequency.

A method according to an exemplary embodiment of this invention will now be described in detail. From calculus, it is known that the slope of any continuous function can be found by taking the first derivative of the function with respect to the variable in question. Furthermore, it is known that by (1) setting the first derivative equal to zero, i.e. the slope equal to 0, and (2) solving for the roots of the variable in question, the value of the variable which causes the maxima and minima of the function to occur can be found. These maxima and minima are the so-called "turnover" points of the curve.

In the context of an example embodiment of the invention, the transfer function H(s) is a continuous function. As shown in the Appendix of this application, which is incorporated by reference herein in its entirety, and in accordance with an aspect of this invention, starting from the transfer function H(s), the peak frequency $f_{PEAK}$ can be derived (see equations (1) through (13) in the Appendix) to arrive at the following equation:

$$f_{PEAK} := \frac{f_{3dB}}{2 \cdot \zeta} \cdot \frac{\sqrt{\sqrt{1 + 8 \cdot \zeta^2} - 1}}{\sqrt{1 + 2 \cdot \zeta^2 + \sqrt{2 + 4 \cdot \zeta^2 + 4 \cdot \zeta^4}}} \quad (14)$$

As seen, then, in ignoring the minima for now, and assuming that the transfer function is a continuous function as mentioned above, the peak frequency of the PLL can be defined as the frequency at which the maximum amplitude of the transfer function occurs. More notably, however, this frequency can be defined mathematically with respect to the damping factor $\zeta$ and the −3 dB cutoff frequency using Equation (14) provided above. This means that the damping factor and the −3 dB cutoff frequency uniquely determine what the peak frequency is. Using mathematical techniques, it is possible to rearrange the equation to solve for the damping factor $\zeta$. Doing so provides that the damping factor $\zeta$ can be represented by a unique mathematical expression in the variables of the −3 dB cutoff frequency and the peak frequency as in equation (15) presented in the Appendix.

Therefore, by measuring the −3 dB cutoff frequency and the peak frequency of the loop, it is possible to determine, with good accuracy, the damping factor of the loop.

Figure 4:
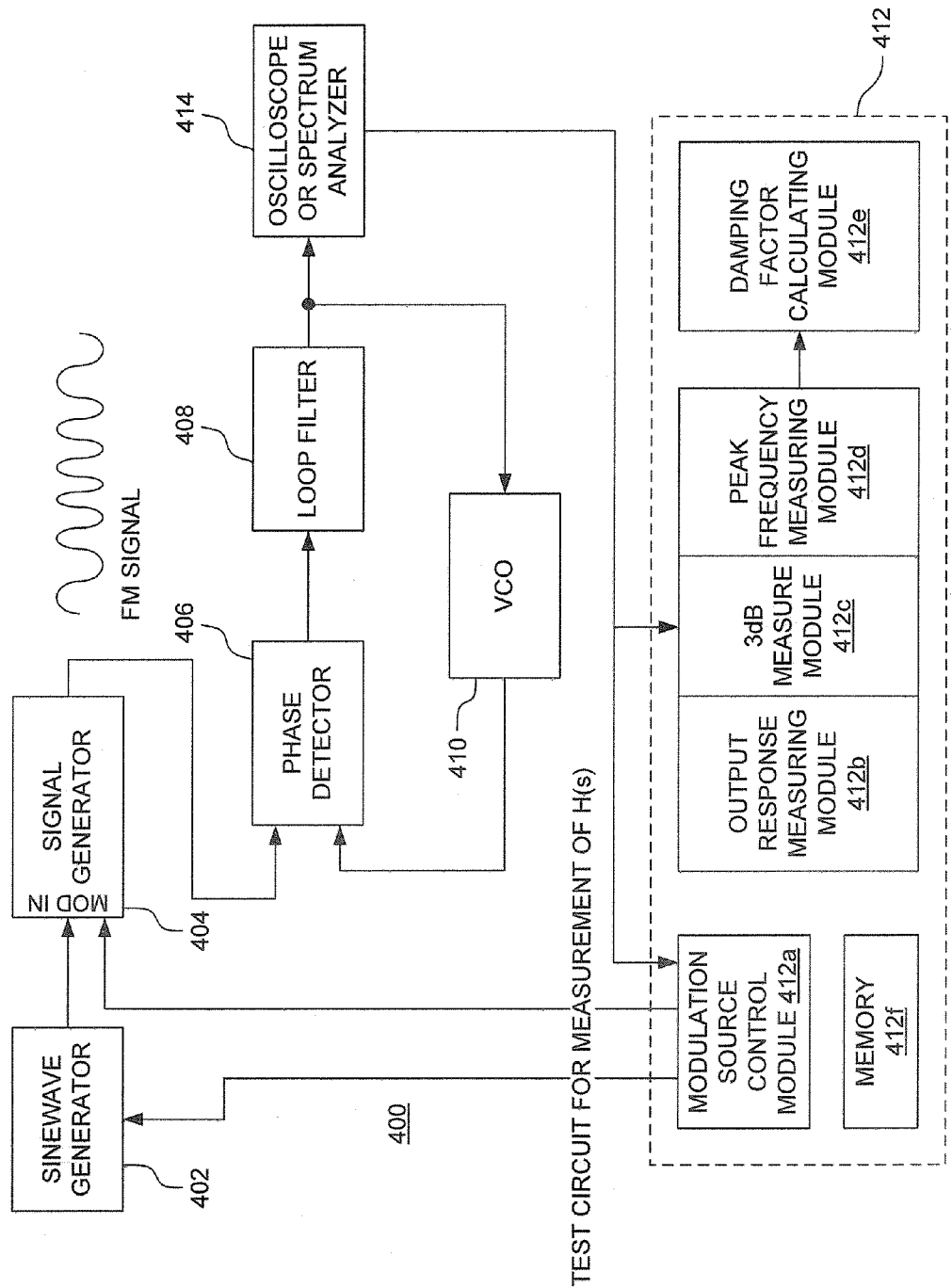
FIG. 4 shows an example setup which may be used in accordance with an example embodiment of the invention to measure the −3 dB cutoff frequency and the peak frequency of the PLL.

FIG. 4 shows an example setup which may be used in accordance with an example embodiment of the invention to measure the −3 dB cutoff frequency and the peak frequency of the PLL. In this example a test circuit 400 includes a sinewave generator 402, a signal generator 404, a phase detector 406, a loop filter 408, a VCO 410, a control module 412, and an oscilloscope or spectrum analyzer 414 which may include a computer or processing unit. Of course, it is to be understood that the test circuit 400 shown in FIG. 4 is by way of illustration and example only, and that various modifications and other test setups for practicing the invention could be readily envisioned.

The sinewave generator 402 provides a sinewave signal to the signal generator 404. The sinewave signal is set up to have a controlled appropriate amplitude and frequency so as to phase/frequency modulate the output of the signal generator 404. The signal generator 404 generates a phase/frequency modulated sinewave (or squarewave) to the PLL input, i.e. the input to the phase detector 406, under test. More particularly, the signal generator 404 uses a modulation input source, generated by the sinewave generator 402 and applied to the signal generator 404, to generate a sinewave (or square wave) with a carrier frequency equal to, or a common multiple of, the output frequency of VCO 410 input to the phase detector 406. The sinewave (or square wave) has low frequency modulation energy at the frequency of interest proportional to the phase/frequency modulation amplitude. The sinewave generator 402 and the signal generator 404 may be combined into a single unit, in other example embodiments.

The phase detector 406 performs a phase and frequency offset comparison between the reference sinewave (or square wave) provided by the signal generator 404 and the sinewave (or square wave) provided by the VCO 410. The phase detector 406 outputs a phase error signal that is proportional to the phase difference between its input signals. The loop filter 408 preferably is a low-pass filter with approximately unity gain at DC. Typically implemented as a first-order low-pass proportional-integral (PI) filter, thereby giving a second-order PLL, the loop filter 408 integrates the phase error signal from the phase detector 406 and provides a voltage output to VCO 410 and component 414. The loop filter 408 responds to phase error indications from the phase detector by "steering" the VCO frequency higher or lower, thereby keeping the output of the VCO 410 locked in frequency and phase with respect to the reference signal from the signal generator 404 (i.e., a feedback control system).

The VCO 410 is a voltage-controlled oscillator that has a voltage input and a frequency output. The frequency at the output of the VCO 410 is proportional to the voltage provided at the input within some specified frequency range. For example, a VCO may have a center frequency (i.e., a nominal frequency) of 100 MHz at its midpoint voltage input. By applying a lower voltage, the oscillator will typically go down in frequency until reaching some minimum specified value. The converse is true for higher applied voltage.

In accordance with an example embodiment of the invention, a modulation source (from generator 404) is applied at the input to the PLL, i.e., at the input to the phase detector 406. A PLL comprises the phase detector 406, the loop filter 408, and the VCO 410. Of course, other components may be provided, such as, for example, dividers between the signal generator 404 and the phase detector 406, although none are shown.

The control module 412 may include a modulation source control module 412a, an output response measuring module 412b, a −3 dB frequency measuring module 412c, a peak frequency measuring module 412d, and a damping factor calculating module 412e.

The modulation source control module 412a is coupled to the sinewave generator 402, the signal generator 404, and the oscilloscope 414, and operates by controlling components 402 and 404 to apply a modulation source in the below-described manner to the input to the PLL and to sweep the frequency as described in more detail below (see, e.g., step S502 of FIG. 5, which will be further described later). The output response measuring module 412b, the −3 dB frequency measuring module 412c, and the peak frequency measuring module 412d are coupled to the component 414. The output response module 412b operates to measure the output response to various levels of frequency modulation (see, e.g., step S502). The −3 dB frequency measuring module 412c operates to measure the −3 dB frequency of the PLL (see, e.g., step S506). The peak frequency measuring module 412d operates to measure the peak frequency of the PLL (see, e.g., step S504). The damping factor calculating module 412e receives the measurements from modules 412b, 412c, and 412d, and calculates the damping factor of the PLL as a function of the −3 dB frequency and the peak frequency using equation (15) set out in the Appendix (step S508).

The control module 412 operates in accordance with software control programs and operating routines stored in an associated memory 412f, which may be part of the control module 412, as shown in FIG. 4, or which may be a separate component. In either case the module 412 and its sub-modules can write and/or read information to/from the memory 412f. According to an example embodiment of the invention, the module 412 operates under the control of the routines/programs stored in the memory 412f. The control module 412 also operates under the control of the routines/programs to perform at least part of a method of this invention for calculating the damping factor of a PLL. See, for example, the method shown in FIG. 5.

Accordingly, FIG. 4 illustrates a logical diagram of modules of an exemplary control module 412 or similarly organized circuit device (e.g., ASIC, PGA, FPGA, and the like) which can perform operations in accordance with a method of the invention. The modules may be implemented using hard-coded computational modules or other types of circuitry, or a combination of software and circuitry modules. In an exemplary embodiment, software routines for performing the depicted modules can be stored as instructions in memory 412f and can be executed by a processor of control module 412. In another example embodiment, the components of the control module 412 may be integral, either as part of a computer (not shown) of the oscilloscope 414, in a separate computer (not shown), or all processing and control functions may be performed at the control module 412 only, depending on applicable design criteria.

Figure 5:
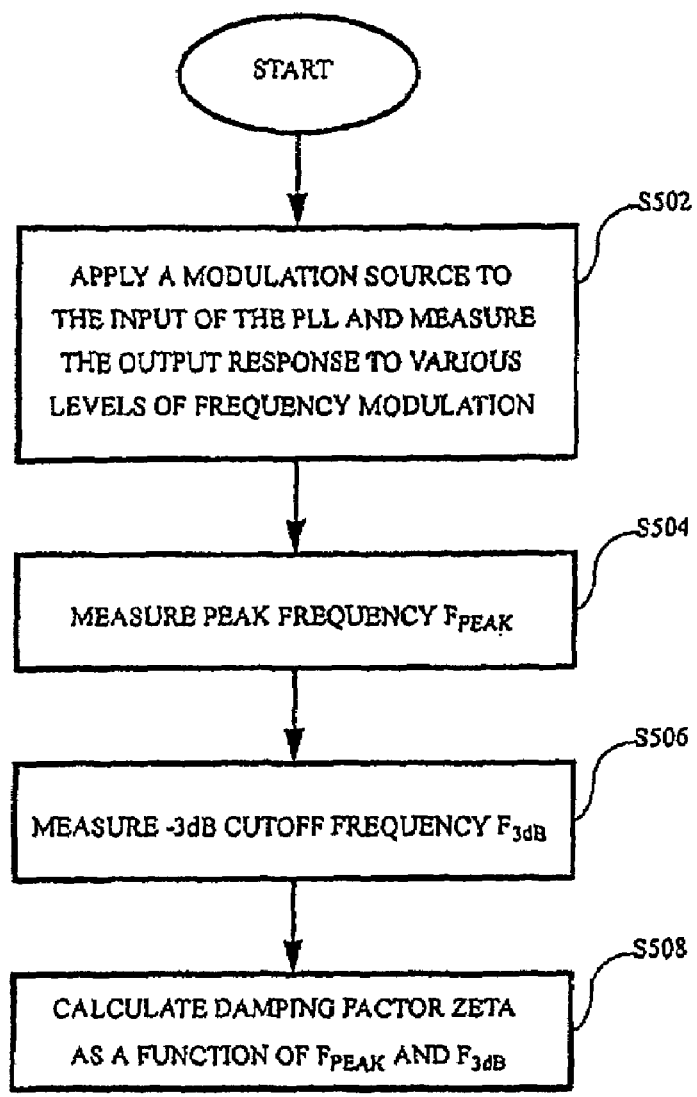
FIG. 5 is a flow diagram of a method in accordance with an exemplary embodiment of this invention.

A method in accordance with an aspect of this invention is shown in the flowchart of FIG. 5. In step S502, the frequency is swept using a sinewave generator (such as for example the sinewave generator 402 shown in FIG. 4) and a signal generator (such as for example the signal generator 404 shown in FIG. 4). This can be done manually by a human operator using a dial (not shown) of each device (for example each device 402 and 404 shown in FIG. 4) or other user interface, or can be done automatically using a program module and software (for example the source control module 412a shown in FIG. 4), with an oscilloscope (for example the oscilloscope 414 shown in FIG. 4) performing automated reads and measurements. Accordingly, in the case of an automatic sweep, the sinewave generator, the signal generator, and the oscilloscope can be controlled via a computer, with program commands acting to turn the dial or sweep the frequency.

Figure 6:
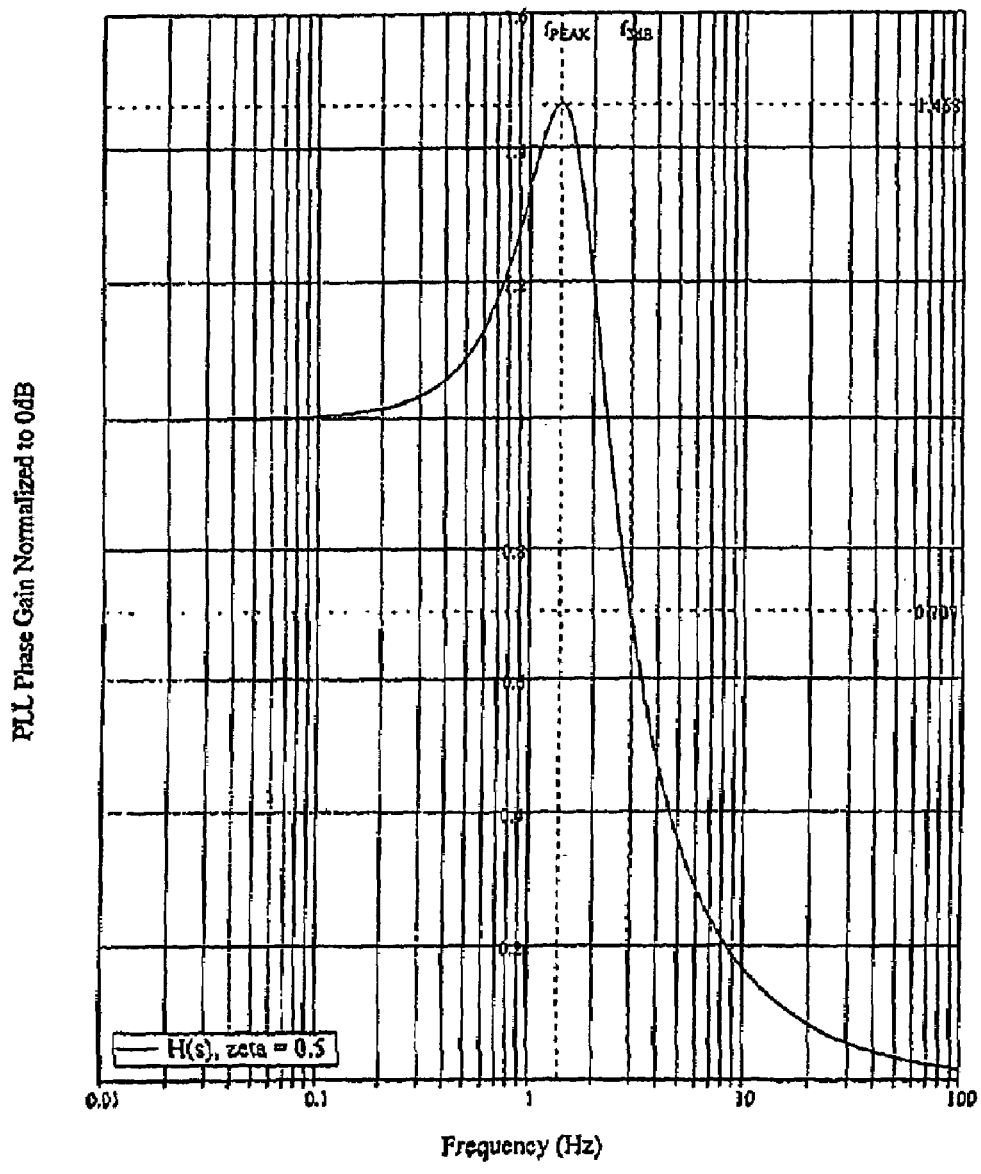
FIG. 6 is a plot showing an example of the measured characteristics that would be recorded by an exemplary embodiment of the invention, normalized to a gain of 1 (0 dB), for an exemplary damping factor of 0.5 and an exemplary −3 dB cutoff frequency of 3 Hz.

Upon sweeping the frequency in step S502, the output response at the output of a loop filter (for example the loop filter 408 shown in FIG. 4), to various levels of frequency modulation is measured by the oscilloscope or spectrum analyzer (e.g. output response module 412b shown in FIG. 4). This results in a plot, shown on the oscilloscope, in a printout, or on a computer screen, such as the example shown in FIG. 6. In particular FIG. 6 shows an example of the measured characteristics that would be recorded by an exemplary embodiment of the invention, normalized to a gain of 1 (0 dB), for an exemplary damping factor of 0.5 and an exemplary −3 dB cutoff frequency of 3 Hz. For this example, the gain peaks at 1.468*unity at a peak frequency of approximately 1.4 Hz.

In step S504 of FIG. 5 the peak frequency $f_{PEAK}$ is measured from the plot, and in step S506 the −3 dB cutoff frequency $f_{3dB}$ is measured from the plot. Such measuring can be done either by a human operator who, for example, visually, reads values from the plot or otherwise obtains them from readings provided by the oscilloscope (for example the oscilloscope 414 shown in FIG. 4) and then plugs the relevant values (e.g. the −3 dB cutoff frequency $f_{3dB}$ and the peak frequency $f_{PEAK}$) into equation (15) described in the Appendix using, e.g., a computer/user interface, to solve for the damping factor ζ as set out below in step S508. Alternatively, the measuring can be done automatically by one or more software modules (e.g. 3 dB frequency measuring module 412c and peak frequency measuring module 412d shown in FIG. 4) which obtain values and then applies the relevant values (e.g. the −3 dB cutoff frequency $f_{3dB}$ and the peak frequency $f_{PEAK}$) into equation (15) described in the Appendix to solve for the damping factor ζ as set out below in step S508. In particular, in step S508, with the measurements completed, the results, i.e. the peak frequency $f_{PEAK}$ and the −3 dB cutoff frequency $f_{3dB}$, are entered into equation (15) to solve for the damping factor ζ of the loop using for example software module 412e.

Accordingly, the PLL characteristics, e.g. the peak frequency FPEAK, the −3 dB cutoff frequency $f_{3dB}$, and the damping factor ζ, can be easily obtained using a unified setup. Moreover, software modules, computer programs, and processing equipment can be used to carry out any or all of the above-mentioned method steps, such that part or all of the process can be automated.

The following is a more detailed example of an example embodiment of a method of the invention, describing a modulation source, frequency sweep, and how the output response is measured. It is of course to be understood that the invention is not limited to this example, and that various modifications may of course be made.

For an assumed PLL bandwidth, the modulation frequency can be swept, using the sinewave generator 402 and the signal generator 404, from about 1 or 2 decades in frequency below the assumed bandwidth, to 2 or 3 decades in frequency above the assumed bandwidth. For example, in the case of an expected loop bandwidth around 100 Hz, the modulation frequency can be swept from a minimum of 1 Hz up to a maximum of 10 kHz. What is meant by "sweep," in this example, is that the modulation frequency is set to some predetermined value using the sinewave generator 402 and the signal generator 404, the output results (i.e. at the output of the loop filter 408) are measured by the oscilloscope 414, and then the next modulation frequency value is employed to generate another result, and so on, until all desired frequencies have been swept. For the case from 1 Hz to 10 kHz, for example, around 40 different points might be measured, equally spaced on a logarithmic frequency plot, so that 10 measurements are obtained between 1 Hz and 10 Hz, 10 measurements between 10 Hz and 100 Hz, 10 measurements between 100 Hz and 1 kHz, and 10 measurements between 1 kHz and 10 kHz, although the invention is not limited to these 40 examples only.

The type of signal seen at the PLL input, i.e. at the input to the phase detector 406, is generally a carrier sinewave or square wave phase-modulated by another sinewave. The frequency of the phase-modulation may be simply one of the 40 described above in the present example, although it is not limited only thereto. The amplitude of the phase-modulation, i.e., how far the modulating waveform causes the signal generator's carrier sinewave or square wave to move, is known as the peak frequency deviation, and is set so that the output of the loop filter 408, e.g. a low-pass filter, doesn't clip at the assumed peak frequency of the transfer function.

For example, assume a 100 Hz −3 dB cutoff frequency on the filter, and that the peak frequency of the transfer function occurs at 10 Hz. In this case, with the frequency of phase-modulation set to 10 Hz, it may be preferred to set the amplitude of the phase-modulation (the peak frequency deviation) as large as possible, while still viewing a clean, undistorted, unclipped sinewave out of the filter. This is largely a trial-and-error type process; the peak frequency deviation starts out relatively small, and is increased until the waveform gets distorted, at which point it is backed off until the maximum value is found that does not produce distortion. Then, all other phase-modulation frequencies can be tested using the same peak frequency deviation, because their amplitudes through the filter will be lower and distortion should not occur. The reason to try to maximize the amplitude is because it makes measurements easier, especially as one moves out to frequencies where a large amount of attenuation occurs. It can become fairly difficult to identify the waveform out of the filter attenuated −30 dB or more in the presence of normal system noise.

It is noted that the output response is generally measured using an oscilloscope, but it can also be measured using other equipment instead, such as, e.g. a spectrum analyzer or a digital multi-meter (DMM). All the measured amplitudes can be normalized against the measurement at the lowest frequency. For the case above with approximately 40 measurements, for example, all results can be normalized to the reading taken at 1 Hz. The reason for this is that at the lowest (near 0 Hz) modulation frequency, it is assumed that the PLL has almost perfect unity gain, and therefore, for all practical purposes, the lowest frequency can represent a good approximation of the loop's gain at DC. Therefore, all results can be related to the assumed unity gain at the lowest frequency measured. The measurement taken at 10 Hz would be related to the measurement at 1 Hz to determine what the gain at 10 Hz is. Similarly, the gain at 100 Hz would be related to the measurement at 1 Hz to determine what is the gain at 100 Hz. Using this scheme of measuring and normalizing the amplitude, a plot of gain vs. frequency (similar to that shown in FIG. 6) can be established from a number of data points. At this point the peak frequency $f_{PEAK}$ and the −3 dB cutoff frequency $f_{3dB}$ are measured, and then entered into equation (15) to solve for the damping factor ζ of the loop.

Thus, as can be appreciated in view of the description, by using the above example embodiment of the invention, the peak frequency can be readily identified for PLLs with a damping factor ζ of less than or equal to 2.0; this is because the peak gain of the transfer function is approximately 1.05*unity or greater (i.e., noticeably greater than unity), making the increased amplitude readily observable on an oscilloscope, digital multi-meter (DMM), or spectrum analyzer. This technique can be used for higher damping factors if a measurement of gains between 1.00*unit and 1.05*unity is employed.

Although the invention has been described in the context of an exemplary embodiment involving $2^{nd}$-order PLLs, broadly construed, the invention is not so limited. In other embodiments the invention can be applied to other higher order PLLs, greater than $2^{nd}$-order PLLs. One having ordinary skill in the art would appreciate in view of this description how to adapt equation (15) to apply to such higher order PLLs.

APPENDIX

It is understood that $s := 2j \cdot \pi \cdot f$, and $\omega_n$ is the natural frequency of the loop in radians/sec.

$$H(s) := \frac{2 \cdot s \cdot \zeta \cdot \omega_n + \omega_n^2}{s^2 + 2 \cdot s \cdot \zeta \cdot \omega_n + \omega_n^2} \text{ explicit, } s \rightarrow \tag{1}$$

$$\frac{2 \cdot 2 \cdot i \cdot \pi \cdot f \cdot \zeta \cdot \omega_n + \omega_n^2}{(2 \cdot i \cdot \pi \cdot f)^2 + 2 \cdot 2 \cdot i \cdot \pi \cdot f \cdot \zeta \cdot \omega_n + \omega_n^2}$$

$$\frac{2 \cdot 2 \cdot i \cdot \pi \cdot f \cdot \zeta \cdot \omega_n + \omega_n^2}{(2 \cdot i \cdot \pi \cdot f)^2 + 2 \cdot 2 \cdot i \cdot \pi \cdot f \cdot \zeta \cdot \omega_n + \omega_n^2} \text{ simplify} \rightarrow \tag{2}$$

$$\omega_n \cdot \frac{4 \cdot i \cdot \pi \cdot f \cdot \zeta + \omega_n}{(-4) \cdot \pi^2 \cdot f^2 + 4 \cdot i \cdot \pi \cdot f \cdot \zeta \cdot \omega_n + \omega_n^2}$$

$$\omega_n \cdot \frac{4 \cdot i \cdot \pi \cdot f \cdot \zeta + \omega_n}{(-4) \cdot \pi^2 \cdot f^2 + 4 \cdot i \cdot \pi \cdot f \cdot \zeta \cdot \omega_n + \omega_n^2} \text{ complex} \rightarrow \tag{3}$$

$$\omega_n^2 \cdot \frac{(-4) \cdot \pi^2 \cdot f^2 + \omega_n^2}{[(-4) \cdot \pi^2 \cdot f^2 + \omega_n^2]^2 + 16 \cdot \pi^2 \cdot f^2 \cdot \zeta^2 \cdot \omega_n^2} +$$

$$13 \cdot \pi^2 \cdot f^2 \cdot \zeta^2 \cdot \frac{\omega_n^2}{[(-4) \cdot \pi^2 \cdot f^2 + \omega_n^2]^2 + 16 \cdot \pi^2 \cdot f^2 \cdot \zeta^2 \cdot \omega_n^2} +$$

$$i \cdot \left[ 4 \cdot \pi \cdot f \cdot \zeta \cdot \omega_n \cdot \frac{(-4) \cdot \pi^2 \cdot f^2 + \omega_n^2}{[(-4) \cdot \pi^2 \cdot f^2 + \omega_n^2]^2 + 16 \cdot \pi^2 \cdot f^2 \cdot \zeta^2 \cdot \omega_n^2} - \right.$$

$$\left. 4\omega_n^3 \cdot \pi \cdot f \cdot \frac{\zeta}{[(-4) \cdot \pi^2 \cdot f^2 + \omega_n^2]^2 + 16 \cdot \pi^2 \cdot f^2 \cdot \zeta^2 \cdot \omega_n^2} \right]$$

The magnitude of the function is then given by:

$$T(f) := \sqrt{\begin{aligned} &\left[ \omega_n^2 \cdot \frac{(-4) \cdot \pi^2 \cdot f^2 + \omega_n^2}{[(-4) \cdot \pi^2 \cdot f^2 + \omega_n^2]^2 + 16 \cdot \pi^2 \cdot f^2 \cdot \zeta^2 \cdot \omega_n^2} + \right. \\ &\left. 16 \cdot \pi^2 \cdot f^2 \cdot \zeta^2 \cdot \frac{\omega_n^2}{[(-4) \cdot \pi^2 \cdot f^2 + \omega_n^2]^2 + 16 \cdot \pi^2 \cdot f^2 \cdot \zeta^2 \cdot \omega_n^2} \right]^2 + \\ &\left[ 4 \cdot \pi \cdot f \cdot \zeta \cdot \omega_n \cdot \frac{(-4) \cdot \pi^2 \cdot f^2 + \omega_n^2}{[(-4) \cdot \pi^2 \cdot f^2 + \omega_n^2]^2 + 16 \cdot \pi^2 \cdot f^2 \cdot \zeta^2 \cdot \omega_n^2} - \right. \\ &\left. 4\omega_n^3 \cdot \pi \cdot f \cdot \frac{\zeta}{[(-4) \cdot \pi^2 \cdot f^2 + \omega_n^2]^2 + 16 \cdot \pi^2 \cdot f^2 \cdot \zeta^2 \cdot \omega_n^2} \right]^2 \end{aligned}} \tag{4}$$

$$T(f) \text{ simplify} \rightarrow 4\omega_n^2 \cdot \pi \cdot f \cdot \left( \omega_n^2 \cdot \frac{\omega_n^2 + 16 \cdot \pi^2 \cdot f^2 \cdot \zeta^2}{16 \cdot \pi^4 \cdot f^4 - 8 \cdot \pi^2 \cdot f^2 \cdot \omega_n^2 + \omega_n^4 + 16 \cdot \pi^2 \cdot f^2 \cdot \zeta^2 \cdot \omega_n^2} \right)^{\frac{1}{2}} \tag{5}$$

Taking the first derivative of the magnitude function, to find the maximum point/turnover point of the curve, and setting the derivative equal to 0:

$$T_{PRIME}(f) := \tag{6}$$

$$\frac{1}{2 \cdot \left( \omega_n^2 \cdot \frac{16 \cdot \pi^2 \cdot f^2 \cdot \zeta^2 + \omega_n^2}{16 \cdot \pi^4 \cdot f^4 - 8 \cdot \pi^2 \cdot f^2 \cdot \omega_n^2 + \omega_n^4 + 16 \cdot \pi^2 \cdot f^2 \cdot \zeta^2 \cdot \omega_n^2} \right)^{\frac{1}{2}}} \cdot$$

$$\left[ 32 \cdot \omega_n^2 \cdot \pi^2 \cdot f \cdot \frac{\zeta^2}{16 \cdot \pi^4 \cdot f^4 - 8 \cdot \pi^2 \cdot f^2 \cdot \omega_n^2 + \omega_n^4 + 16 \cdot \pi^2 \cdot f^2 \cdot \zeta^2 \cdot \omega_n^2} - \right.$$

$$\left. \omega_n^2 \cdot \frac{16 \cdot \pi^2 \cdot f^2 \cdot \zeta^2 \cdot \omega_n^2}{(16 \cdot \pi^4 \cdot f^4 - 8 \cdot \pi^2 \cdot f^2 \cdot \omega_n^2 + \omega_n^4 + 16 \cdot \pi^2 \cdot f^2 \cdot \zeta^2 \cdot \omega_n^2)^2} \cdot \right.$$

$$\left. (64 \cdot \pi^4 \cdot f^3 - 16 \cdot \pi^2 \cdot f \cdot \omega_n^2 + 32 \cdot \pi^2 \cdot f \cdot \zeta^2 \cdot \omega_n^2) \right]$$

-continued $$T_{PRIME}(f) \text{ simplify} \rightarrow 8 \cdot \pi^2 \cdot f \cdot \omega_n^2 \cdot \tag{7}$$

$$\frac{(-32) \cdot \pi^4 \cdot f^4 \cdot \varsigma^2 - 4 \cdot \pi^2 \cdot f^2 \cdot \omega_n^2 + \omega_n^4}{\left( \omega_n^2 \cdot \frac{\omega_n^2 + 16 \cdot \pi^2 \cdot f^2 \cdot \varsigma^2}{16 \cdot \pi^4 \cdot f^4 - 8 \cdot \pi^2 \cdot f^2 \cdot \omega_n^2 + \omega_n^4 + 16 \cdot \pi^2 \cdot f^2 \cdot \varsigma^2 \cdot \omega_n^2} \right)^{\frac{1}{2}} \cdot} \cdot$$

$$(16 \cdot \pi^4 \cdot f^4 - 8 \cdot \pi^2 \cdot f^2 \cdot \omega_n^2 + \omega_n^4 + 16 \cdot \pi^2 \cdot f^2 \cdot \varsigma^2 \cdot \omega_n^2)^2$$

$$\omega_{3dB} := 2 \cdot \pi f_{3dB} \tag{8}$$

$$\omega_n := \frac{\omega_{3dB}}{\sqrt{1 + 2 \cdot \zeta^2 + \sqrt{2 + 4 \cdot \zeta^2 + 4 \cdot \zeta^4}}} \tag{9}$$

The part of $T_{PRIME}$ that is relevant is the numerator, as everything else factors out since $T_{PRIME}(f) = 0$:

$$T_{PRIME}(f) := 32 \cdot \pi^4 \cdot f^4 \cdot \zeta^2 + 4 \cdot \pi^2 \cdot f^2 \cdot \omega_n^2 - \omega_n^4 \text{ explicit,} \tag{10}$$

$$\omega_n, \omega_{3dB} \rightarrow$$

$$32 \cdot \pi^4 \cdot f^4 \cdot \zeta^2 + 4 \cdot \pi^2 \cdot f^2 \cdot \left( \frac{2 \cdot \pi \cdot f_{3dB}}{\sqrt{1 + 2 \cdot \zeta^2 + \sqrt{2 + 4 \cdot \zeta^2 + 4 \cdot \zeta^4}}} \right)^2 -$$

$$\left( \frac{2 \cdot \pi \cdot f_{3dB}}{\sqrt{1 + 2 \cdot \zeta^2 + \sqrt{2 + 4 \cdot \zeta^2 + 4 \cdot \zeta^4}}} \right)^4$$

Factoring out $(16 * \pi^4)$:

$$T_{PRIME}(f) := 2 \cdot \zeta^2 \cdot f^4 + f^2 \cdot \frac{f_{3dB}^2}{1 + 2 \cdot \zeta^2 + \sqrt{2 + 4 \cdot \zeta^2 + 4 \cdot \zeta^4}} - \tag{11}$$

$$\left[ \frac{f_{3dB}^4}{\left(1 + 2 \cdot \zeta^2 + \sqrt{2 + 4 \cdot \zeta^2 + 4 \cdot \zeta^4}\right)^2} \right]$$

Substituting for f so that the formula can be expressed as a quadratic equation with the highest power equal to 2:

$$f := \sqrt{x} \tag{12}$$

$$T_{PRIME}(f) \rightarrow 2 \cdot \zeta^2 \cdot x^2 + x \cdot \frac{f_{3dB}^2}{1 + 2 \cdot \zeta^2 + (2 + 4 \cdot \zeta^2 + 4 \cdot \zeta^4)^{\frac{1}{2}}} - \tag{13}$$

$$\frac{f_{3dB}^4}{\left[1 + 2 \cdot \zeta^2 + (2 + 4 \cdot \zeta^2 + 4 \cdot \zeta^4)^{\frac{1}{2}}\right]^2}$$

The roots of the quadratic equation are found, the square root is taken (to get back to a function of f) and the result is:

$$f_{PEAK} := \frac{f_{3dB}}{2 \cdot \zeta} \cdot \frac{\sqrt{\sqrt{1 + 8 \cdot \zeta^2} - 1}}{\sqrt{1 + 2 \cdot \zeta^2} + \sqrt{2 + 4 \cdot \zeta^2 + 4 \cdot \zeta^4}} \quad (14)$$

$$\zeta(f_{3dB}, f_{PEAK}) = \frac{1}{12 \cdot f_{3dB}^2 \cdot f_{PEAK} \cdot \left[ \left[ 6 \cdot f_{PEAK}^6 \cdot f_{3dB}^2 + 6 \cdot f_{3dB}^4 \cdot f_{PEAK}^4 - 28 \cdot f_{3dB}^6 \cdot f_{PEAK}^2 - \right. \right.} \cdot \left[ (-2) - \left[ \left[ 6 \cdot f_{PEAK}^6 \cdot f_{3dB}^2 + 6 \cdot f_{3dB}^4 \cdot f_{PEAK}^4 - \right. \right. \right.$$

(Equation 15 — a very large multi-line expression involving $f_{PEAK}$ and $f_{3dB}$ with terms such as $28 \cdot f_{PEAK}^6 \cdot f_{3dB}^2$, $54 \cdot f_{PEAK}^8 \cdot f_{3dB}$, $6 \cdot 3^{1/2}$, $27 \cdot f_{3dB}^8$, nested radicals and cube roots, and exponents including $\frac{1}{2}$, $\frac{2}{3}$, $\frac{1}{3}$, and a final $\frac{1}{2}$.)

(15)

In the foregoing description, the invention is described with reference to a specific example embodiment thereof. The specification and drawings are accordingly to be regarded in an illustrative rather than in a restrictive sense. It will, however, be evident that various modifications and changes may be made thereto, in a computer program product or software, hardware, or any combination thereof, without departing from the broader spirit and scope of the present invention.

Software embodiments of the present invention may be provided as a computer program product, or software, that may include an article of manufacture on a machine accessible or machine readable medium (memory) having instructions. The instructions on the machine accessible or machine readable medium may be used to program a computer system or other electronic device. The machine-readable medium may include, but is not limited to, floppy diskettes, optical disks, CD-ROMs, and magneto-optical disks or other types of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

While the invention has been particularly shown and described with respect to a preferred embodiment thereof, it should be understood that the embodiment has been presented by way of example, and not limitation. It will be apparent to persons skilled in the relevant art(s) that various changes in form and detail can be made therein without departing from the spirit and scope of the present invention. Thus, the present invention should not be limited by any above-described exemplary embodiment, but should be defined only in accordance with the following claims and their equivalents.

In addition, it should be understood that the figures illustrated in the attachments, which highlight the functionality and advantages of the present invention, are presented for example purposes only. The architecture of the present invention is sufficiently flexible and configurable, such that it may be utilized (and navigated) in ways other than that shown in the accompanying figures.

Furthermore, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way. It is also to be understood that the steps and processes recited in the claims need not be performed in the order presented.

Having described the invention, what is claimed as new and secured by Letters Patent is:

1. A method for measuring the damping factor of an $N^{th}$-order phase-locked loop, wherein N>1, comprising the steps of:
    applying a modulation source at an input to the phase-locked loop;
    measuring an output response to various levels of frequency modulation;
    measuring a −3 dB cutoff frequency of the phase-locked loop;
    measuring a peak frequency of the phase-locked loop;
    calculating the damping factor of the phase-locked loop as a function of the −3 dB cutoff frequency and the peak frequency.

2. The method of claim 1, wherein N=2.

3. The method of claim 1, further comprising the step of providing a test circuit for measuring a transfer function which describes the frequency-domain behavior of the phase-locked loop.

4. The method of claim 3, wherein the test circuit comprises a sinewave generator, a signal generator, and an oscilloscope.

5. The method of claim 1, wherein the phase-locked loop comprises a phase detector, a loop filter, and a voltage-controlled oscillator.

6. The method of claim 5, wherein the loop filter comprises a low-pass filter.

7. A system for measuring the damping factor of an $N^{th}$-order phase-locked loop, wherein N>1, comprising:
    a modulation source adapted to apply an input to the phase-locked loop;
    at least one unit adapted to generate an output response to various levels of frequency modulation and calculate the damping factor of the phase-locked loop as a function of a −3 dB cutoff frequency and a peak frequency of the generated output response.

8. The system of claim 7, wherein N=2.

9. The system of claim 7, further comprising a −3 dB cutoff frequency measuring unit adapted to measure the −3 dB cutoff frequency of the phase-locked loop.

10. The system of claim 7, further comprising a peak frequency measuring unit adapted to measure the peak frequency of the phase-locked loop.

11. The system of claim 7, wherein the at least one unit is a test unit comprising a sinewave generator, a signal generator, and an oscilloscope.

12. The system of claim 7, wherein the phase-locked loop comprises a phase detector, a loop filter, and a voltage-controlled oscillator.

13. The system of claim 12, wherein the loop filter comprises a low-pass filter.

14. A system for measuring the damping factor of an $N^{th}$-order phase-locked loop, wherein N>1, comprising:
    a modulation unit, adapted to apply an input to the phase-locked loop;
    a first measuring unit, adapted to measure an output response to various levels of frequency modulation;
    a second measuring unit, adapted to measure a −3 dB cutoff frequency of the phase-locked loop;
    a third measuring unit, adapted to measure a peak frequency of the phase-locked loop; and
    a calculating unit, adapted to calculate the damping factor of the phase-locked loop as a function of the −3 dB cutoff frequency and the peak frequency.

15. The system of claim 14, wherein N=2.

16. The system of claim 14, wherein the at least one unit is a test unit comprising a sinewave generator, a signal generator, and an oscilloscope.

17. The system of claim 14, wherein the phase-locked loop comprises a phase detector, a loop filter, and a voltage-controlled oscillator.

18. The system of claim 17, wherein the loop filter comprises a low-pass filter.

* * * * *